(12) United States Patent
Walski et al.

(10) Patent No.: US 8,639,483 B1
(45) Date of Patent: Jan. 28, 2014

(54) COMPUTER MODELING SOFTWARE FOR ANALYSIS OF THE CRITICALITY OF ELEMENTS IN A WATER DISTRIBUTION SYSTEM

(75) Inventors: Thomas M. Walski, Nanticoke, PA (US); Robert F. Mankowski, Watertown, CT (US); Shaoyu Yang, Southbury, CT (US); Jack S. Cook, Jr., Bethlehem, CT (US); Ronghe Wang, Watertown, CT (US); Daniel Bishop, Springfield, MA (US); Daniel Bowdler, Waterville, CT (US); Zheng Yi Wu, Watertown, CT (US); Robert A. Gurrieri, Thomaston, CT (US)

(73) Assignee: Bentley Systems, Incorporated, Exton, PA (US)

( * ) Notice: Subject to any disclaimer, the term of this patent is extended or adjusted under 35 U.S.C. 154(b) by 675 days.

(21) Appl. No.: 11/607,606

(22) Filed: Dec. 1, 2006

(51) Int. Cl.
*G06G 7/50* (2006.01)
*G06G 7/48* (2006.01)

(52) U.S. Cl.
USPC .................................. 703/9; 702/51; 702/100

(58) Field of Classification Search
USPC ........................................ 703/9; 702/51, 100
See application file for complete search history.

(56) References Cited

U.S. PATENT DOCUMENTS

| 7,013,248 B1 | 3/2006 | Todini et al. |
| 2006/0060246 A1 | 3/2006 | Schuetze et al. |

OTHER PUBLICATIONS

Savic et al. "Genetic Operators and Constraint Handling for Pipe Network Optimization" Lecture Notes in Computer Science vol. 993. 1995.*
Tsihrintzis et al. "Use of Geographic Information Systems in Water Resources: A Review" Water Resources Management 10 pp. 251-277, 1996.*
Ozger et al. "Optimal Location of Isolation Valves in Water Distribution Systems: A Reliability/Optimization Approach.".*
Walski, "Valves and Water Distribution System Reliability", AWWA Conference New York 1994.*
Ozger et al. "Optimal Location of Isolation Valves in Water Distribution Systems: A Reliability/Optimization Approach." Sep. 2004.*
Tsihrintzis et al. "Use of Geographic Information Systems in Water Resources: A Review" Water Resources Management pp. 251-277, 1996.*
Savic et al. "Genetic Operators and Constraint Handling for Pipe Network Optimization" Lecture Notes in Computer Science vol. 993.1995.*
Jun "Strategic Valve Locations in a Water Distribution System" May 2005.*

(Continued)

*Primary Examiner* — Saif Alhija
(74) *Attorney, Agent, or Firm* — Cesari and McKenna, LLP

(57) ABSTRACT

A method and system for performing a criticality analysis of a water distribution network is provided. The method and system provides for segmentation of the system which allows a user to determine the set of elements that comprise segments, which in turn are the smallest portion of a water distribution system that can be isolated by valving. Isolating valves are included as elements in the set of elements that are used by an associated hydraulic solver engine to segment the water distribution network. Once the network has been segmented, a criticality analysis is performed whereby a hydraulic simulation is run for an outage of one or more segments, and the shortfall in demand supplied to other segments is calculated. The system provides for a linking of the ability to automatically identify segments with a hydraulic analysis model to enable a user not only to identify segments, but to rank their importance based on a variety of user defined metrics.

21 Claims, 9 Drawing Sheets

(56) References Cited

OTHER PUBLICATIONS

Fujiwara et al. "Reliability analysis of water distribution networks in consideration of equity, redistribution, and pressure-dependent demand" Abstract Water Resrouces Research 1998.*

Thomas M. Walski, Justin S. Weiler, Teresa Culver, "Using Criticality Analysis to Identify Impact of Valve Location", $8^{th}$ Annual Water Distribution Systems Analysis Symposium, Cincinnati, Ohio, Aug. 27-30, 2006, 9 Pages.

Rob Casey, Paul F. Boulos, Chun Hou Orr, Christopher M. Bros, "Valve Criticality Modeling", 8th Annual Water Distribution Systems Analysis Symposium, Cincinnati, Ohio, Aug. 27-30, 2006, 8 Pages.

T.M. Baranowski, T.M. Walski, Z.Y. Wu, R. Mankowski, W. Hartell, "Trading Off Reliability and Cost in Optimal Water Distribution System Design", World Water and Environmental Resource Congress 2003, Jun. 23-26, 2003, 10 Pages.

Thomas M. Walski, "Valves and Water Distribution System Reliability", American Water Works Association Annual Conference, New York, 1994, 14 Pages.

Thomas M. Walski, "Issues in Providing Reliability in Water Distribution Systems", ASCE EWRI Conference, Roanoke, VA, 2002, 10 Pages.

Thomas M. Walski, "Water Distribution Valve Topology for Reliability Analysis", Reliability Engineering and System Safety 42 (1993) Elsevier Science Publishers Ltd, England, 7 Pages (21-27).

Ian Goulter, Thomas M. Walski, Larry W. Mays, Burca Sakarya, Francious Bouchart, Y. K. Tung, "Reliability Analysis for Design", Water Distribution Systems Handbook, Chapter 18, Department of Civil and Environmental Engineering, Arizona State University, Tempe, AZ, McGraw Hill, 2000.

"Criticality and Segmentation", Bentley WaterGEMS User's Guide, Jul. 4, 2006, pp. 2-271-2-287.

"Criticality Analysis", Bentley WaterCAD v8 xm Edition User's Guide, Released Jul. 4, 2006, pp. 10-458-10-468.

Cheung et al., "Extension of Epanet for Pressure Driven Demand Modeling in Water Distribution System", http://artigocientifico.tebas.kinghost.net/uploads/artc_1147708476_40.pdf, Jun. 3, 2005, pp. 1-6.

Lewis A. Rossman, "EPANET 2 Users Manual," United States Environmental Protection Agency, Water Supply and Water Resources Division, National Risk Management Research Laboratory, Cincinnati, OH 45268, Sep. 2000, pp. 1-200.

* cited by examiner

Segmentation and Criticality [Valve130.wtg]

Segmentation Scope | Segmentation Results

| Label | Segment | Isolation Elements (Count) | Pipes (Count) | Nodes (Count) | Segment Length (ft) | Fluid Volume of Segment (ft³) | Segment Color |
|---|---|---|---|---|---|---|---|
| All Segments (51) | | | | | | | |
| Segment - 1 | | | | | | | |
| Segment - 2 | | | | | | | |
| Segment - 3 | | | | | | | |
| Segment - 4 | | | | | | | |
| Segment - 5 | | | | | | | |
| Segment - 6 | | | | | | | |
| Segment - 7 | | | | | | | |
| Segment - 8 | | | | | | | |
| Segment - 9 | | | | | | | |
| Segment - 10 | | | | | | | |
| Segment - 11 | | | | | | | |
| Segment - 12 | | | | | | | |
| Segment - 13 | Segment - 14 | 4 | 4 | 1 | 1,225.20 | 240.57 | 0, 0, 255 |
| Segment - 14 | Segment - 15 | 3 | 3 | 1 | 364.53 | 71.58 | 0, 0, 255 |
| Segment - 15 | Segment - 16 | 6 | 7 | 2 | 1,625.97 | 324.74 | 0, 255, 0 |
| Segment - 16 | Segment - 17 | 2 | 2 | 1 | 465.98 | 91.5 | 255, 0, 0 |
| Segment - 17 | Segment - 18 | 2 | 2 | 1 | 534.43 | 110.98 | 255, 0, 0 |
| Segment - 18 | Segment - 19 | 2 | 4 | 1 | 913.06 | 186.78 | 0, 0, 255 |
| Segment - 19 | Segment - 20 | 2 | 2 | 1 | 883.80 | 173.53 | 0, 0, 255 |
| Segment - 20 | Segment - 21 | 3 | 3 | 1 | 1,086.15 | 213.27 | 255, 0, 0 |
| Segment - 21 | Segment - 22 | 5 | 5 | 1 | 2,095.09 | 507.51 | 255, 0, 0 |
| Segment - 22 | Segment - 23 | 4 | 4 | 1 | 1,098.70 | 215.73 | 0, 0, 255 |
| Segment - 23 | Segment - 24 | 2 | 2 | 1 | 620.01 | 121.74 | 255, 0, 0 |
| Segment - 24 | Segment - 25 | 3 | 3 | 1 | 1,504.80 | 163.17 | 0, 0, 255 |
| Segment - 25 | Segment - 26 | 4 | 4 | 1 | 1,476.87 | 463.36 | 0, 0, 255 |
| Segment - 26 | Segment - 27 | 3 | 3 | 1 | 925.16 | 181.65 | 255, 0, 0 |
| Segment - 27 | Segment - 28 | 6 | 6 | 1 | 1,494.04 | 445.02 | 255, 0, 0 |
| Segment - 28 | Segment - 29 | 3 | 3 | 1 | 814.14 | 275.38 | 0, 0, 255 |
| Segment - 29 | Segment - 30 | 4 | 4 | 1 | 1,206.44 | 420.09 | 0, 0, 255 |
| Segment - 30 | | | | | | | |

Affected Nodes | Isolating Nodes | Pipes

| Segment | Label | Element Type |
|---|---|---|
| 1 | Segment - 1 | 282:J-201 | Junction |
| 2 | Segment - 1 | 284:J-202 | Junction |
| 3 | Segment - 2 | 272:J-113 | Junction |
| 4 | Segment - 3 | 280:J-200 | Junction |
| 5 | Segment - 3 | 278:PRV-1 | PRV |
| 6 | Segment - 4 | 84:T-1 | Tank |

Criticality Studies
- Avg. Daily Demand
  - Outage Segments
  - Criticality
- AvgDayPDD
  - Outage Segments
  - Criticality
- EPS
  - Outage Segments
  - Criticality

FIG. 3

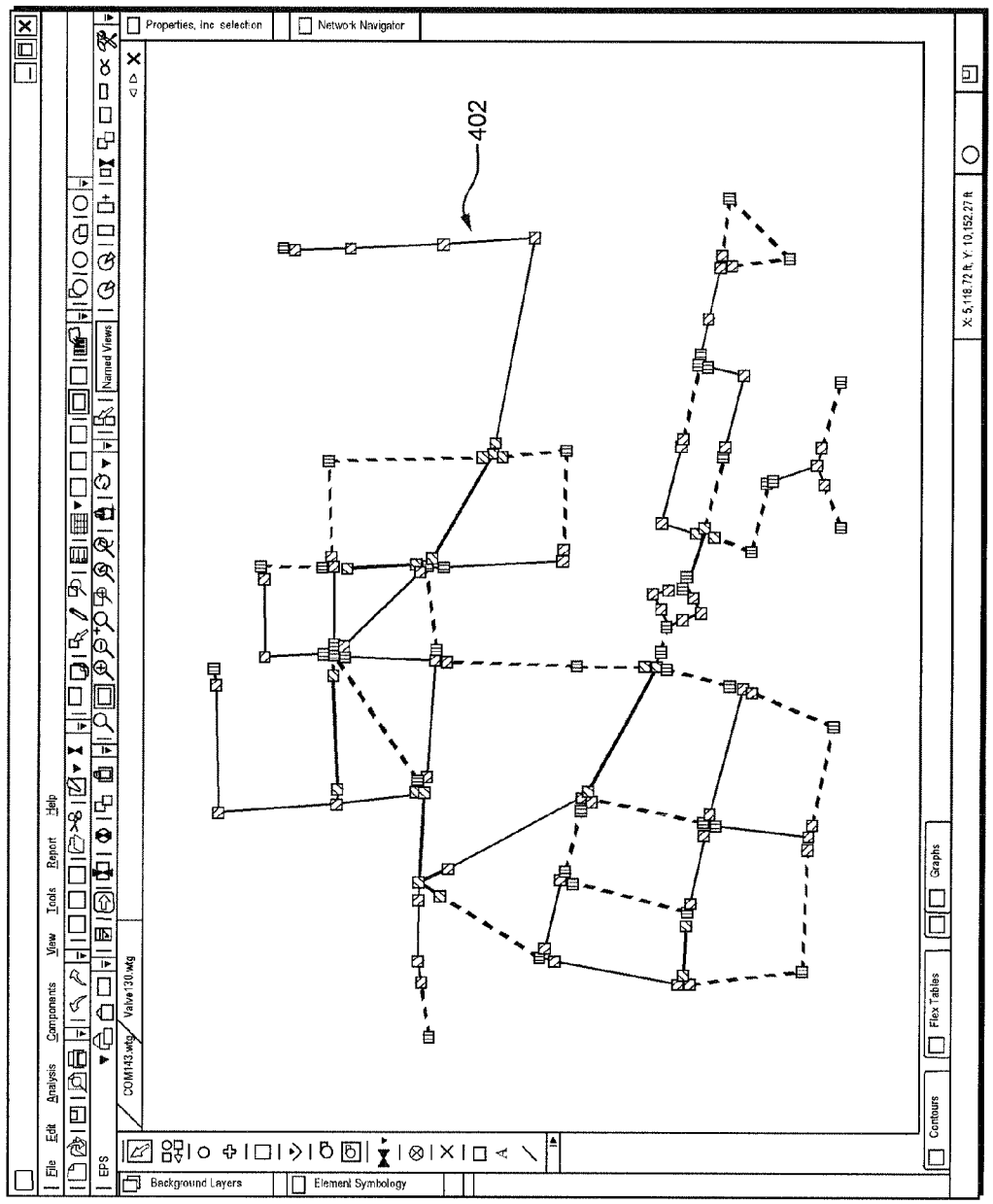

Segmentation and Criticality [Valve130.wtg]

☑ Run Hydraulic Engine?
Minimum Pressure to Supply Demand  0.00  lbs/in²
Maximum Required Demand Shortfall  0.0  %

Criticality Studies
- Avg. Daily Demand
  - Outage Segments
  - Criticality ← 604
- AvgDayPDD
  - Outage Segments
  - Criticality
- EPS
  - Outage Segments
  - Criticality Label: All Criticality Segments (51)

Criticality Segment - 1
Criticality Segment - 2
Criticality Segment - 3
Criticality Segment - 4
Criticality Segment - 5
Criticality Segment - 6
Criticality Segment - 7
Criticality Segment - 8
Criticality Segment - 9
Criticality Segment - 10
Criticality Segment - 11
Criticality Segment - 12
Criticality Segment - 13
Criticality Segment - 14
Criticality Segment - 15
Criticality Segment - 16
Criticality Segment - 17
Criticality Segment - 18
Criticality Segment - 19
Criticality Segment - 20
Criticality Segment - 21
Criticality Segment - 22
Criticality Segment - 23
Criticality Segment - 24
Criticality Segment - 25
Criticality Segment - 26
Criticality Segment - 27
Criticality Segment - 28
Criticality Segment - 29
Criticality Segment - 30
Criticality Segment - 31

606 →

| | Segment | Are all demands met? | Is Balanced? | Maximum Allowable Demand Shortfall (%) | System Demanded Flow (gpm) | System Supplied Flow (gpm) | System Demand Shortfall (%) | Node with Largest Percent Demand Shortfall |
|---|---|---|---|---|---|---|---|---|
| 39 | Criticality Segment - 40 | ☐ | ☑ | 0.0 | 792.00 | 543.00 | 31.4 | 234:J-103 |
| 40 | Criticality Segment - 41 | ☐ | ☑ | 0.0 | 792.00 | 543.00 | 31.4 | 234:J-103 |
| 41 | Criticality Segment - 42 | ☐ | ☑ | 0.0 | 792.00 | 543.00 | 31.4 | 234:J-103 |
| 10 | Criticality Segment - 11 | ☐ | ☑ | 0.0 | 792.00 | 692.00 | 12.6 | 77:J-4 |
| 15 | Criticality Segment - 16 | ☐ | ☑ | 0.0 | 792.00 | 692.00 | 12.6 | 64:J-1 |
| 33 | Criticality Segment - 34 | ☐ | ☑ | 0.0 | 792.00 | 708.00 | 10.6 | 247:J-109 |
| 8 | Criticality Segment - 9 | ☐ | ☑ | 0.0 | 792.00 | 712.00 | 10.1 | 79:J-2 |
| 27 | Criticality Segment - 28 | ☐ | ☑ | 0.0 | 792.00 | 737.00 | 6.9 | 58:J-3 |
| 37 | Criticality Segment - 38 | ☐ | ☑ | 0.0 | 792.00 | 740.00 | 6.6 | 236:J-104 |
| 32 | Criticality Segment - 33 | ☐ | ☑ | 0.0 | 792.00 | 756.00 | 4.5 | 251:J-111 |
| 36 | Criticality Segment - 37 | ☐ | ☑ | 0.0 | 792.00 | 757.00 | 4.4 | 240:J-106 |

620 →

Affected Nodes | Isolating Nodes | Pipes

| | Segment | Label | Element Type |
|---|---|---|---|
| 1 | Criticality Segment - 30 | 56:J-13 | Junction |
| 2 | Criticality Segment - 30 | 228:J-101 | Junction |
| 3 | Criticality Segment - 30 | 232:J-102 | Junction |
| 4 | Criticality Segment - 30 | 234:J-103 | Junction |
| 5 | Criticality Segment - 30 | 236:J-104 | Junction |
| 6 | Criticality Segment - 30 | 238:J-105 | Junction |
| 7 | Criticality Segment - 30 | 240:J-106 | Junction |
| 8 | Criticality Segment - 30 | 242:J-107 | Junction |

FIG. 6

Segmentation and Criticality [Valve130.wtg]

700

Summary | Options

Segmentation Results Summary — 702

| Label | Time Analysis Type | Consider Valves? | Maximum Segment Length (ft) | Total Number of Segments <Court> |
|---|---|---|---|---|
| Avg. Daily Demand | Steady State | ☑ | 2,382.40 | 51 |
| AvgDayPDD | Steady State | ☑ | 2,382.40 | 51 |
| EPS | EPS | ☑ | 2,382.40 | 51 |

Criticality Results Summary — 704

| Label | Are Segments Based on Hydraulics? | Are Segments Based on Valving? | Largest System Shortfall (%) | Average System Shortfall (%) |
|---|---|---|---|---|
| Avg. Daily Demand | ☑ | ☑ | 33.3 | 5.1 |
| AvgDayPDD | ☑ | ☑ | 37.7 | 13.3 |
| EPS | ☑ | ☑ | 33.3 | 5.1 |

Criticality Studies
- Avg. Daily Demand
  - Outage Segments
  - Criticality
- AvgDayPDD
  - Outage Segments
  - Criticality
- EPS
  - Outage Segments
  - Criticality

FIG. 7

COMPUTER MODELING SOFTWARE FOR ANALYSIS OF THE CRITICALITY OF ELEMENTS IN A WATER DISTRIBUTION SYSTEM

BACKGROUND OF THE INVENTION

1. Field of the Invention

This invention relates to computer models for analyzing the hydraulics and reliability of water distribution systems.

2. Background Information

Water distribution systems are expected to provide water virtually all of the time in spite of failures in individual components in the system. Thus, efforts have been made to quantify and increase the reliability of such systems. There are several ways of increasing reliability including looping pipes, including thicker walled pipes, providing standby power for pumps, improving operator training, installing additional system storage, segmenting the system and providing adequate valves to isolate small areas of the system. Failing to make one or more of these improvements may determine whether a minor outage turns into a major system failure.

Another priority goal in any water distribution system in a community is to provide adequate fire flow. A further challenge is to provide water distribution to growing neighborhoods, which may not have been part of an early plan and may not have adequate distribution pipes. In order to design, repair and evaluate water distribution systems in view of the above-described dynamic aspects of those systems, water engineers use hydraulic models, which are computer models that describe the network elements and simulate the operation of the water distribution network, and can be used to assess the reliability of such distribution systems.

Portions of a water distribution system need to be taken out of service from time to time for maintenance and repairs. The portion of the system that is taken out of service is limited by the placement of isolating valves. More specifically, isolating valves allow a segment of a water distribution system to be sectioned off, while still providing water supply to customers through the remainder of the network. The higher the density of isolating valves, the fewer customers who are put out of service and the smaller the impact on the overall system operation. A tradeoff exists between the number of valves in a system, and the cost. It is noted, however, typically when a pipe line fails, a "segment" of the distribution system is affected, as is defined by the portion of the system that can be isolated using isolation valves.

Many water distribution network computer modeling programs present the system as a set of links (pipes) and nodes (junctions of pipes). In order to simulate a pipe outage, the modeler will remove a link from the model. However, an outage actually removes an entire distribution segment, which is defined by the valves that can be used to isolate the outage, not simply one pipe link. Conventional software models require segmentation outages to be performed manually. In such systems, the location of isolating valves within the system is not always readily apparent to the user.

Such prior modeling programs contain elements like pipes, junctions, pumps and the like. But these elements are not appropriate for performing a criticality analysis because a shut down of some portion of the water system does not affect a single one of those elements or even a set of them, but rather a collection of elements and importantly, parts of such elements. The various approaches that exist to identify critical outage segments of a water distribution system do not take into account the location of isolation valves. This failure to precisely to account for isolation valve locations generates misleading results. In addition, isolating valves are typically not treated as junction nodes in models, and thus they are difficult to locate within the model.

Moreover, segmentation of the network has presented a problem for hydraulic models because, as noted, segments do not correspond directly to pipe links. In fact, a segment almost rarely consists of an entire single pipe link, but rather some collection of pieces of pipe links. Therefore, working with segments requires a different network topology in the model than pipe network analysis alone.

Therefore, there remains a need for a hydraulic model software program that can be readily implemented within a computer hydraulic model platform which program stores isolating valve elements at their correct locations along pipes in the model. There remains a further need for method for automatic generation of segments and a system for correctly identifying the impact of loss of such a segment, thereby identifying the criticality of such a segment.

SUMMARY OF THE INVENTION

The disadvantages of prior techniques are overcome by the present invention which is a new component that can be incorporated into an existing computer program for modeling a water distribution system that analyzes the criticality of elements in a water distribution system based on the ability to isolate segments. The criticality process operates in conjunction with a hydraulic modeling platform computer program. The hydraulic modeling platform contains information about the water distribution system, such as pipes, junction nodes, pumps, storage tanks, and, in accordance with the present invention, it also contains information about isolating valves, and uses isolating valves as elements that can be represented in the module.

In accordance with a first aspect of the invention, a segmentation routine identifies segments based on the position of such isolating valves and other elements, such as control valves, which the user can identify as isolating elements. The routine uses graph theory to search out the components and bounding elements for each segment. This can be done for the entire system or for a portion of the system as identified by the user. In accordance with the invention, a graphic user interface allows the user to use a segment routine to color code the map of the system so that each segment can be readily visualized. The segmentation routine itself can be used to characterize troublesome segments which could become critical segments should an outage occur.

In accordance with a further aspect of the invention, a criticality process quantifies the impact of shutting down each segment of the system. The criticality of the segment is based on the short fall that results upon an outage of that segment, where short fall is calculated using functions related to the ratio of actual demand satisfied to total demand. Several metrics can be used to identify the short fall of segments in accordance with the invention. These include whether the short fall is based on connectivity only or on hydraulic analysis. Further, the software program of the present invention allows the user to choose whether a hydraulic analysis is based on the steady state or an extended period simulation. The software program of the present invention also provides the user the choice of whether to evaluate pressure dependant demands or fixed demands in the hydraulic calculation. Various scenarios can be selected by the user and the simulation is run to determine the impact of segment outage under these scenarios which thereby indicates the criticality of the selected segments in the water distribution system. The results of the criticality calculation can be displayed in a user interface that can readily show the impact of the outage of a particular segment. Summary statistics on the reliability of the distribution as a whole are also be provided in accordance with the invention, and reported in an easy to use screen for a computer work station.

BRIEF DESCRIPTION OF THE DRAWINGS

The above and further advantages of the invention can be better understood with reference to the accompanying drawings in which like reference characters refer to the same or similar elements, of which:

FIG. 3 is a screen shot of a graphic user interface generated in accordance with the present invention for segmentation results;

FIG. 4 is a screen shot of a distribution system which is color coded to illustrate the segments in the system in accordance with an illustrative embodiment of the present invention;

FIG. 6 is a screen shot which identifies the criticality of each segment in the system;

FIG. 7 is a screen shot which shows a summary report regarding the segmentation and criticality for the water distribution system;

DETAILED DESCRIPTION OF AN ILLUSTRATIVE EMBODIMENT

Figure 1:
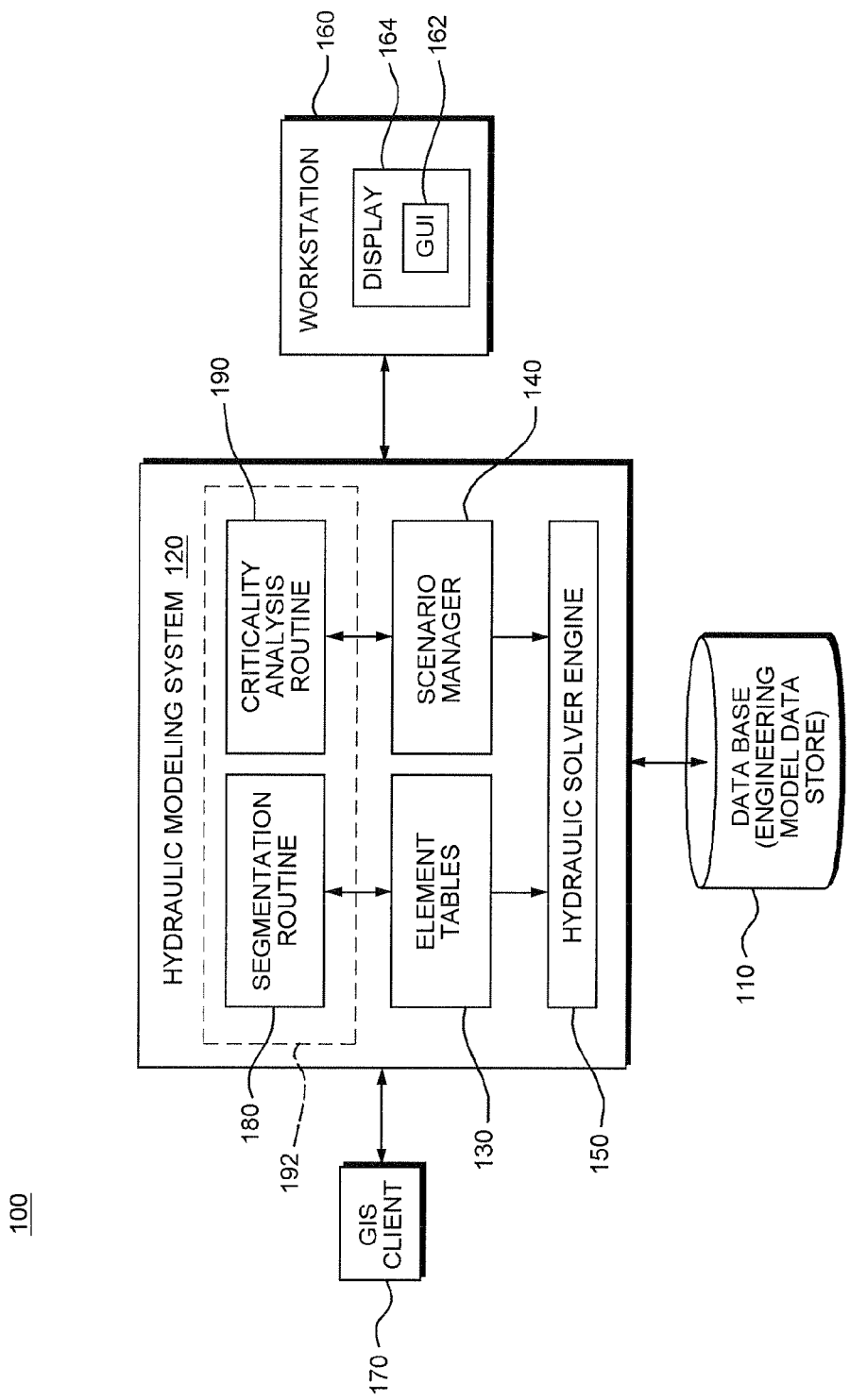
FIG. 1 is a schematic illustration of the software processes in accordance with an illustrative embodiment of the present invention.

The system and method of the present invention are embodied in a system 100, which is schematically illustrated in FIG. 1. The system 100 includes a database 110, which stores the data describing the elements of the engineering model, i.e., the water distribution network being represented. The database includes hierarchical records which identify these elements and their attributes. Further details about the storage and use of engineering modeling data with which the present invention can be used, are provided in commonly owned U.S. Pat. No. 7,107,280 for a METHOD AND SYSTEM FOR THE STORAGE AND USE OF ENGINEERING MODELING ALTERNATIVES WITH UNITIZED DATA, which issued on Sep. 12, 2006, which is presently incorporated by reference herein in its entirety.

A software interface (not shown) such as an object model is used for programmatic access to the data stored in the database 110 and this data is thus made available to a hydraulic modeling system 120. The hydraulic modeling system 120 may be any suitable modeling platform such as the platform sold commercially under the trademarks WATER GEMS® and WATER CAD®, by Bentley Systems of Pennsylvania, which is illustrative only, and it should be understood that the invention is readily adaptable for use with other hydraulic modeling software platforms.

The hydraulic modeling system 120 includes element tables 130, which are used to store the particular elements that are then being represented and analyzed by the user, such as a water engineer. These elements can be configured and analyzed in a model created under various scenarios, as selected by the user using a scenario manager 140. The scenario manager 140 implements in software, certain "what if" scenarios, using the elements stored in the element table 130. A hydraulic solver engine 150 then runs a simulation of the water distribution system represented by the hydraulic model for that selected scenario using the information about the elements identified in the element tables 130. The water engineer can then evaluate the behavior of the water distribution network, as simulated, and can then make informed decisions about the design or rehabilitation of an actual water distribution network.

As discussed further herein, a modeling engineer programmer uses a work station 160 which may be a personal computer (PC) or other work station to enter data or make selections between options provided by the present invention. The entries made by the programmer at the work station 160 are used by the hydraulic network solver engine 150 to simulate the behavior of the network in accordance with the specification selected by the user. Various graphic interfaces (GUI's 162), which are described in further detail hereinafter, are displayed on a display 164 in the form of maps, graphs, charts and tables at the programmers work station 160, or at an end user terminal via the Internet or other connection to the hydraulic network solver engine 150 within the hydraulic modeling software system 120. The programmer's workstation 160 may also run various applications, such as a GIS (Geographic Information Systems) or CAD (Computer Aided Design) clients 170, which may be used to generate a topological representation of the hydraulic network, as generated by the hydraulic network solver engine 150.

In accordance with the invention, a user can to determine the impact on overall system performance of a portion of the system that fails or is taken out of service. The portion of the system, comprised of elements, is identified as a segment. A segment or "network segment" is the smallest portion of a distribution system that can be isolated by valving. In accordance with the invention, a segmentation routine 180 uses the information in the elements table 130 to automatically identify segments in the network. The information about the identified segments is then passed to a criticality analysis routine 190 of the present invention. The segmentation routine 180 and the criticality analysis routine 190 together form a segmentation and criticality manager 192. The hydraulic solver engine 150 takes segments of the distribution system and simulates such segments as having failed or having been taken out of service for performance of maintenance or repairs. The impact of this segment taken outage is then calculated by the criticality analysis routine 190 and the results are presented on the display 164 for evaluation by the user, as described further herein.

Figure 2:
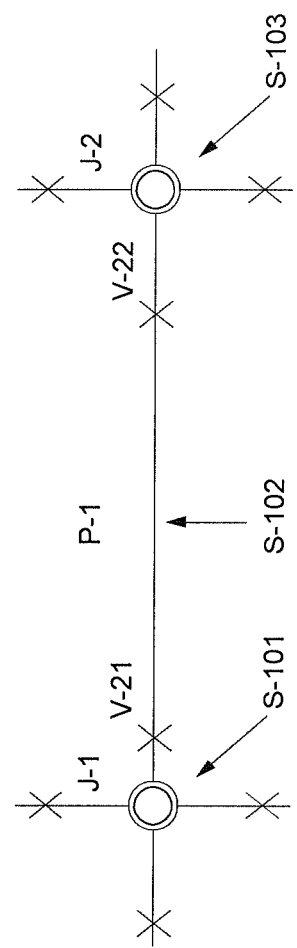
FIG. 2 is a schematic illustration showing the relationship of a segment to other elements in the hydraulic model produced by the applicants.

FIG. 2 illustrates a segment and depicts its relationship to the other elements of a hydraulic model. A typical hydraulic model contains pipes such as the pipe P1 and junction nodes, such as the junction nodes J-1 and J-2, shown in FIG. 2. Segment S-101, segment S-102 and segment S-103 are segments which depict the flow through valves illustrated by X's. As noted herein, a segment is the smallest portion of a distribution system that can be isolated by valving. In accordance with the present invention, the valves V-21 and V-22 are included in the model as elements are stored in a data structure which is illustratively implemented as the element table 130. The element information is used by the hydraulic solver engine 110 to construct the model displayed for the user at the workstation 164.

For example, as illustrated in FIG. 3, the screen shot 300 is a segmentation and criticality screen. In the pane 302, "average daily demand" has been selected. Also available for selection are average daily PDD ("pressure dependent demand"), and EPS ("extended period simulation"). The segmentation results tab 304 can be used to select a list of all segments shown in the list 306. The lower tab 310 is used to select affected nodes. Segment-1, is labeled as 282:J-201, as shown in the column 312. The element type is a junction, as shown in line 314 of column 316. Segment 3, for example, includes a label 278:PRV1, indicating that it is a pressure relief valve, as illustrated in line 318. Segment 4 has a label 84:T-1, and it is a storage tank as illustrated in line 320. The window 330 lists each segment and the number of isolation elements that are contained in that segment. For example, segment 14 has four isolation elements; it also has four pipes and one node. The segment length is given as 1,225.20 feet, and the fluid volume passing through the segment is 240.57 ft$^3$. The segment color is provided as blue, and the segment coordinates on the network are provided.

The segments identified in the screen 300 can alternatively be illustrated graphically. FIG. 4 illustrates a portion of a system map 400, which is color coded by segment. The screen shot 400, which shows the results of the segmentation routine, can be used by the modeling engineer to identify troublesome segments. For example, it may be undesirable for a segment to be of excessive length, such as the segment 402.

Additionally, another important value is the volume of water in the segment that must be drained before repairs can be made. This feature is illustrated in FIG. 4 for each segment and is also readily apparent in column 332 in the GUI 300 of FIG. 3. The segment 22, for example, has a large volume of water passing through it, and thus it may be a segment that should be flagged for possible further isolation using additional valving. Another indicator of a potential problem along a segment is a large number of isolating valves that must be operated in order to isolate the segment. As will be understood by those skilled in the art, time is consumed when such isolating valves must be turned off, and this time could be critical, particularly in a fire flow or other event. When a large number of isolating valves must be turned, there is a chance that one or more of them may be inoperative. A large number of isolating valves is apparent from the screen 400.

Figure 5:
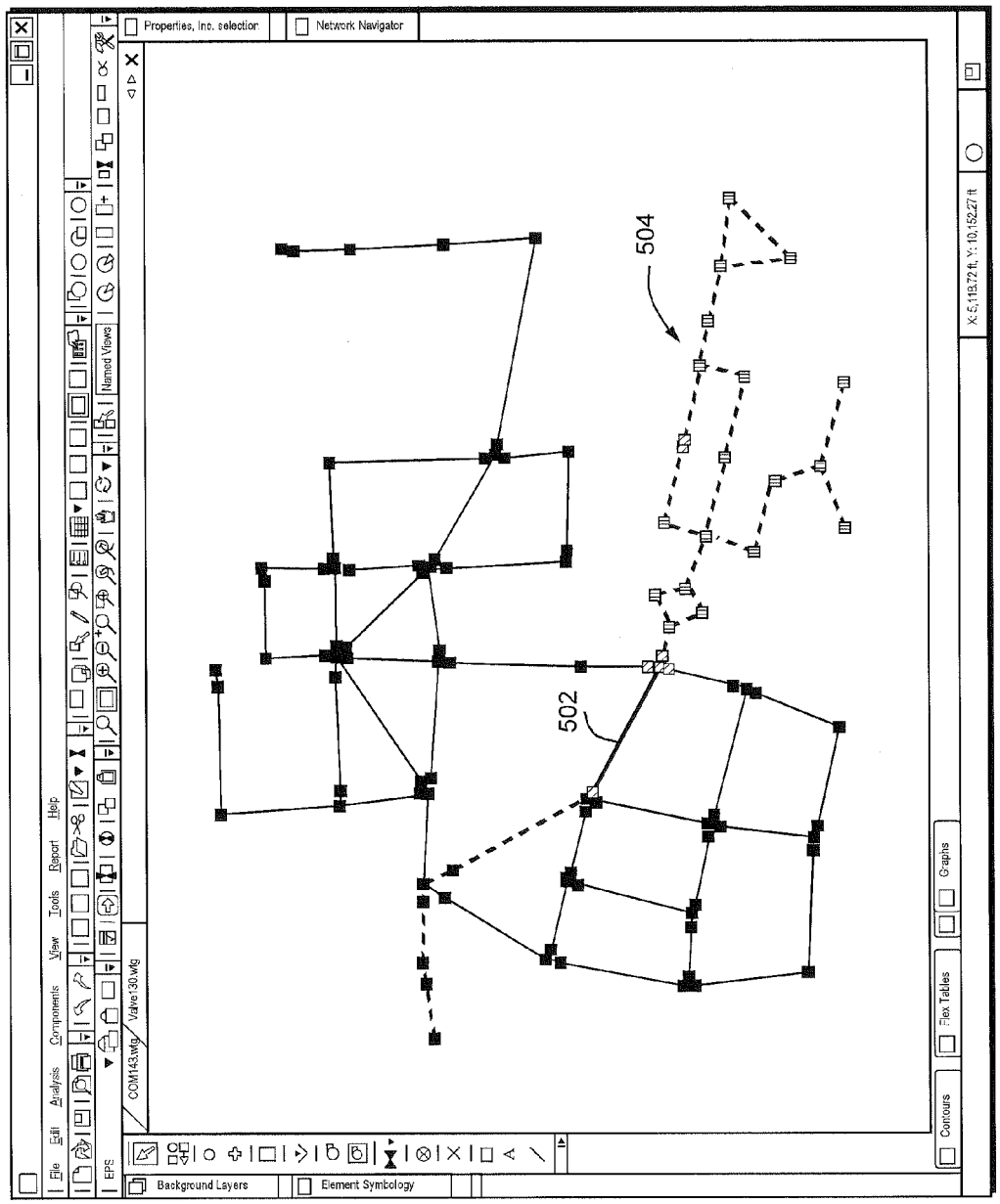
FIG. 5 is a screen shot which can be used to quantify the impact of shutting down each segment.

Once segments have been identified using the segmentation routine 180 of the present invention, it is further possible to identify "outage segments." These are segments downstream of the particular segment being considered, which outage segments also lose service when the segment in question is shut down. In accordance with one illustrative embodiment of the invention, for example, a segment being shut down can be shown in blue, while the associated outage segments are shown in red. This is better understood with reference to FIG. 5, which is a screen shot 500 that illustrates a blue segment 502. If segment 502 is shut down, this results in the shut down of the large segment 504 because the main distribution line to that segment 504 is provided by the segment 502.

After the network is segmented, the segmentation and criticality manager 192 provides the user with an option of running a criticality analysis scenario. This selected criticality analysis is performed by the criticality analysis routine 190. More specifically, once segments have been identified, the criticality analysis routine 190 is used to quantify the impact of shutting down each segment. The criticality of a segment is quantified is based on the short fall in the segment, where short fall is defined herein as the ratio of net demand to total demand. In accordance with the invention, there are several metrics that can be used to quantify the short fall of segments. These include:

1. short fall can be based on connectivity only or a hydraulic analysis;
2. the hydraulic analysis can be based on steady state or extended period simulation; and
3. the hydraulic analysis calculations may use pressure dependent demands.

As shown in the GUI 600 of FIG. 6, pane 602 provides options for selecting the type of criticality study to be run by the criticality analysis routine 190. In the example shown in FIG. 6, an average daily demand criticality study has been selected. The criticality segments are identified in the list 606. The node with the largest percent demand short fall is identified for each segment, as illustrated in the Column 610. The affected nodes can be studied in the lower window 620, for a particular criticality segment. For example, the criticality segment 30, the first affected node is identified by the label 56:J-13 and the element type is junction. The shutting down of some segments can so interfere with system operation that the pipe network equations cannot be solved (balanced). In that case, the column 630 labeled "Is balanced" is unchecked.

FIG. 7 is a graphic user interface 700, which is generated by the criticality analysis routine 190; it provides summary of statistics on the reliability of the distribution system as a whole. The summary tab 702 can be selected, which provides a segmentation results summary and, for example, the average daily demand for a steady state. The criticality results summary is provided in the window 704, which shows that, for example, for the average daily demand run, the segments are based on hydraulics and valving and the largest system short fall is 33.3% and the average system shortfall is 5.1.

In accordance with a further aspect of the invention, the criticality analysis routine also has the ability to calculate the hydraulic impact of the outages that are being simulated. More specifically, if an engineer is simply viewing the segmentation graph to determine whether there are troublesome segments, this evaluation is typically based on connectivity, valve location and the length of the segment. However, there are hydraulic impacts that may not be readily apparent when simply viewing the segmented map of the system FIG. 4, that is being evaluated.

There are, illustratively, three possible responses of demands to an outage:

1. no (or virtually no) impact;
2. zero flow supply because of the outage segment; and
3. reduction in a flow supply because of drop in pressure.

The first two impacts can be determined readily. The third effect, however, requires the establishment of a relationship between pressure and flow supply. This relationship is called a pressure dependent demand (PDD) function. The PDD calculation, illustratively is based on an orifice equation by default, because the flow leaves the distribution system by way of orifices. However, it should be understood that the user can specify other monotonically increasing relationships while remaining within the scope of the present invention. Most models are fixed demand models and cannot account for the impact of pressure on flow supply. However, the hydraulic modeling and criticality program of the present invention allows for modeling pressure dependent demand. More specifically, the PDD function used by the system 100 (FIG. 1) of the present invention is, for example, given by:

$$Q=0, \text{if } P<0$$

$$Q=Q_{ref}\sqrt{P/P_{ref}}, \text{if } 0<P<P_{ref}$$

$$Q=Q_{ref}, \text{if } P>P_{ref}$$

Where
Q=flow supplied, in feet
$Q_{ref}$=demand with no pressure shortfall, in feet
P=actual pressure, in PSI
$P_{ref}$=pressure above which all demand is met, in PSI By way of example, a study was performed in which a reference pressure $P_{ref}$ of 28 m (40 PSI) was used. This means that, as long as the pressure exceeds 28 m, all demands were met; when the pressure dropped below 28 m, the flow supply, Q, dropped to below flow demanded in accordance with the above equation.

Further in accordance with the invention, a criticality analysis can be for steady state hydraulics. In the alternative, an extended period simulation (EPS) can be run as the basis for the criticality analysis. In such an EPS simulation, with respect to including isolating valves as elements in the water distribution network, the modeler can include pressure relief valves (PRVs) and general purpose valves, and can decide whether to use those types of valves to isolate segments. This may be better understood with reference to the flow chart of FIG. 8.

Figure 8:
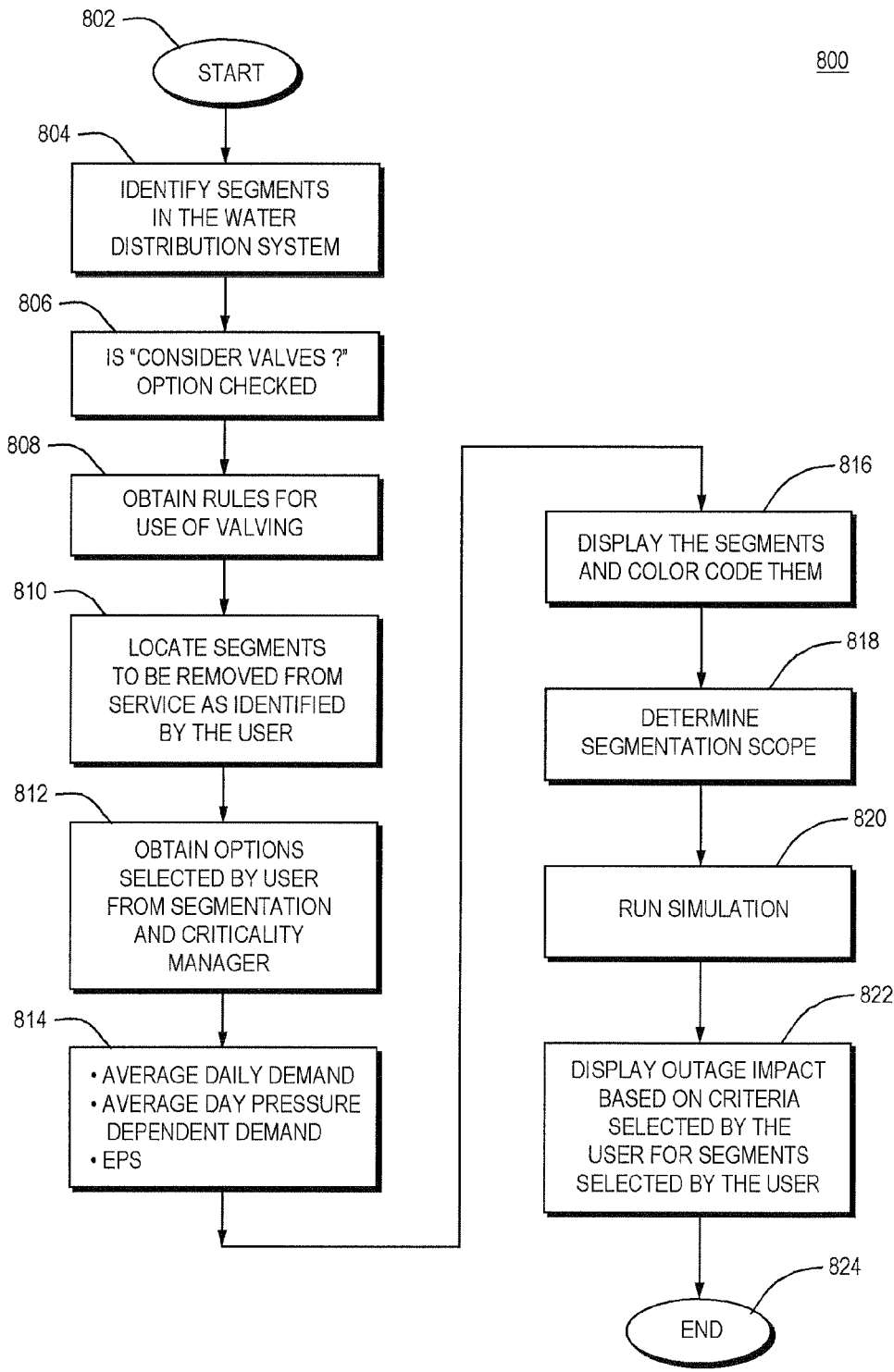
FIG. 8 is a flow chart of a procedure in accordance with the method of the present invention.

FIG. 8 is a flow chart of a procedure 800 detailing the method of performing a criticality analysis in accordance with the present invention. The procedure begins at the start step 802 and continues to step 804 in which the program identifies segments in the water distribution network. The manner in which the segmentation process is performed depends upon selections made by the user. For example, it is first determined whether the user has selected segmentation using valves. More specifically, a segment is created when valves are closed to isolate a portion of a distribution system. If the user has entered isolating valves into the modeling system and these valves are assigned to pipes, then the program automatically identifies segments. These segments can consist of a portion of a single pipe or several pipes and their interconnecting node elements. The user selects this type of segment as in step 806.

Figure 9:
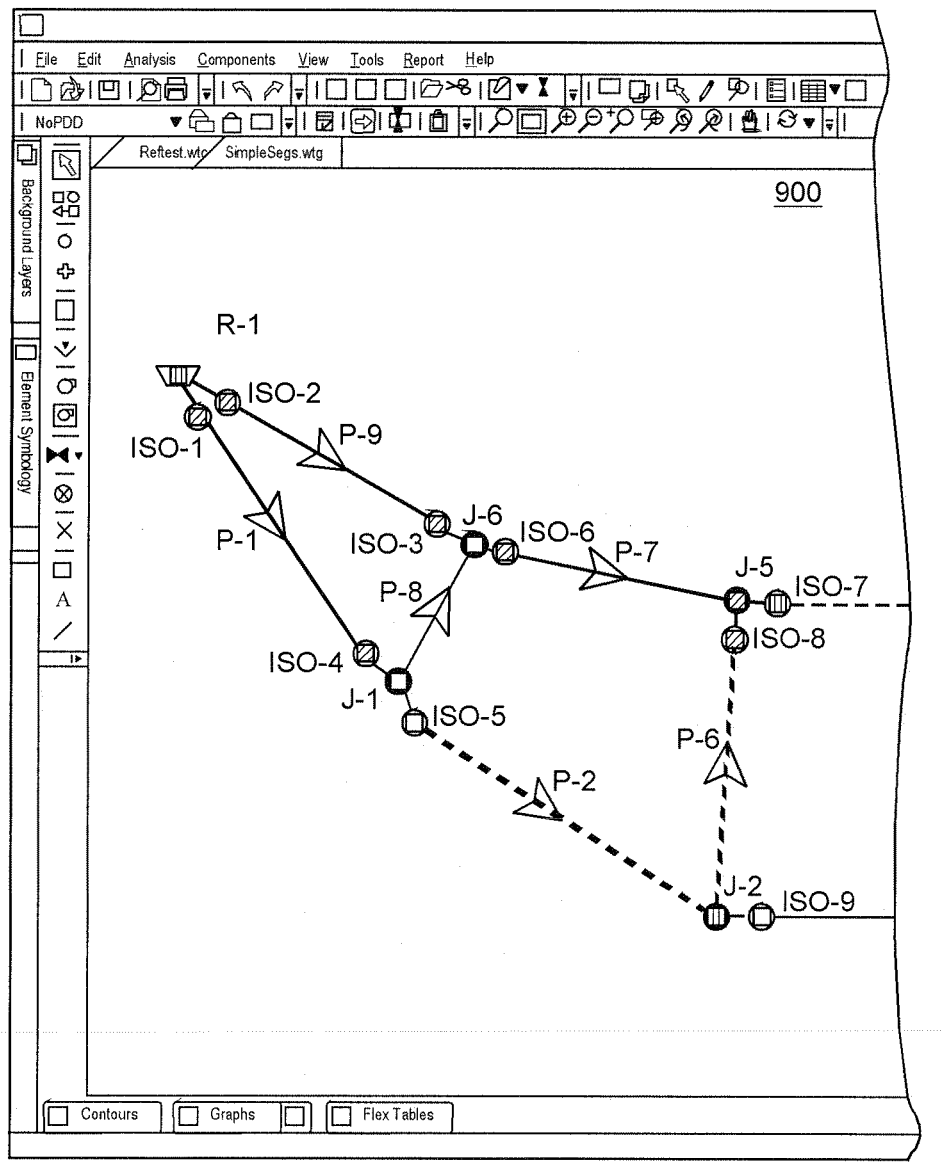
FIG. 9 is an illustrative screen shot of the segmentation and criticality user interface in accordance with the present invention.

A graphic user interface 900 as illustrated in FIG. 9, in which the user had checked the "Consider valves?" box in the Options tab of the Segmentation and Criticality Studies manager screen 700 (FIG. 7). The screen shot 900 illustrates the isolating valves, such as the valves ISO-1 and ISO-2, and highlights in different colors, the segments formed by such valves.

In other circumstances, the rules for valving are selected by the user, as shown in step 808. Depending on the approach used by the modeler, elements such as pressure reducing valves (PRVs) and General Purpose Valves (GPVs) may also be used to isolate segments. For each of these types of elements, the user can indicate whether they should be used to isolate the system. For each type of element, the user, illustratively has three options:

Always use (default)—valve is treated as an isolating valve for segmentation

Use when closed—status of closed if assigned in initial conditions for that scenario Do not use—does not use this valve as a boundary to a segment.

Having segmented the network, in accordance with the user's preferences, the procedure continues to step 810 in which the particular segments for which an outage to be simulated are selected. As to these segments, the program allows the user to select certain options for the criticality run, as in step 812. The scenarios that can be selected by the user are set forth in step 814, and they include performing the criticality run for the average daily demand, so that the program calculates the impact that an outage or failure of the segments selected by the user will have on the average daily demand for each selected segment. Alternatively, the user can choose that the criticality analysis is run for the average pressure dependent demand. Measuring PDD in accordance with the present invention was discussed above. The user can alternatively select an extended period simulation.

In step 816, the segments are displayed and color coded, as illustrated in FIG. 9. The scope of the criticality analysis may then be further narrowed in step 818. Thereafter the criticality analysis is run in accordance with the user's selected options, in step 820. In step 822, the outage impact is illustrated for evaluation by the user. The procedure ends at step 824.

In summary, the hydraulic modeling and criticality analysis system of the present invention has the ability for the user to place all the isolating valves in the correct location within the network. The use of isolating valves to identify segments provides for a more accurate criticality analysis. It should be understood then that the hydraulic modeling and criticality analysis system of the present invention is configured to contain isolating valve elements, which are needed to correctly identify segments, which in turn are used to correctly identify critical elements. Thus, criticality analysis has been linked by the hydraulic modeling system software of the present invention with distribution segments based upon the location of isolating valves for water distribution analysis. The invention provides an easy to use process for identifying distribution system segments, and determining impact of a shut down of a segment within a hydraulic analysis model. The linking of the ability to automatically identify segments with a hydraulic analysis model enables the user to not only identify segments, but to rank their importance in terms of criticality based on a variety of user defined metrics.

It should be understood that the foregoing description has been directed to specific embodiments of the invention. It will be apparent, however, that other variations and modifications may be made to the describe embodiments, with the attainment of some or all of the advantages of such. Therefore, it is the object of the impending claims to cover all such variations and modifications as come become within the true spirit and scope of the invention.

What is claimed is:

1. A method of performing a criticality analysis in a water distribution network model of an actual system, comprising the steps of:

generating a model of the water distribution network based upon a set of elements, the set of elements including a plurality of pipes, a plurality of nodes and a plurality of isolating valves;

automatically identifying, by a hydraulic modeling platform, segments of the water distribution network based at least on locations of the isolating valves in the model of the water distribution network to produce a list of the segments of the water distribution network, the segments being the smallest portion of the water distribution network, including a plurality of elements or portions of elements, that can be isolated by valving, at least some of the segments including one or more pipes or portions of pipes and one or more nodes;

displaying, by the hydraulic modeling platform, the list of the segments on a display to a user;
simulating an outage of each of the segments using the hydraulic modeling platform;
calculating, by the hydraulic modeling platform, a criticality of each of the segments using one or more pressure dependent demand (PDD) functions, wherein the criticality of a segment includes a system demand shortfall defined as a ratio between actual demand satisfied by the water distribution network and total demand if the segment experienced the outage such that the plurality of elements of the segment are isolated from the rest of the water distribution network;
displaying, by the hydraulic modeling platform, a list of the system demand shortfall for each of the segments on the display to the user; and
displaying, by the hydraulic modeling platform, a criticality summary that includes an average system demand shortfall for the water distribution network on the display to the user.

2. The method as defined in claim 1 where the calculating a criticality step further comprises determining a shortfall in demand at a node of the water distribution network that occurs upon an outage of each of the segments.

3. The method as defined in claim 2 comprising the further step of calculating the hydraulic impact of the outages that are being simulated.

4. The method as defined in claim 3 comprising the further step of calculating the hydraulic impact of the outages that are being simulated by determining an impact of pressure on flow supply by modeling pressure dependent demand in one or more selected segments.

5. The method as defined in claim 4 comprising the further steps of determining an impact of pressure on flow supply by determining points in the one or more selected segments at which pressure drops below a predetermined amount such that flow supply drops below flow demanded.

6. The method as defined in claim 1 comprising the further step of identifying segments that have high criticality as segments that satisfy at least one of the following:
   a. a segment that is characterized by having at least a particular length;
   b. a segment that carries at least a particular volume of water;
   c. a segment that includes at least a particular number of isolating valves that must be operated in order to isolate the segment.

7. The method as defined in claim 1 comprising the further step of providing valves as elements in the set of elements being used to generate the model and for each valve to be used as an element, determining whether the valve should be used to isolate the system under one of the following conditions:
   a. treating the valve as an isolating valve for segmentation;
   b. assigning the valve a status of closed, if assigned in initial conditions for a selected scenario; and
   c. not using the valve as a boundary.

8. A non-transitory computer readable storage medium for performing segmentation and criticality analysis for a water distribution network, comprising program instructions for:
generating a model of the water distribution network based upon a set of elements, the set of elements including a plurality of pipes, a plurality of nodes and a plurality of isolating valves;
automatically identifying segments of the water distribution network based at least on locations of the isolating valves in the model of the water distribution network to produce a list of the segments of the water distribution network, the segments being the smallest portion of the water distribution network, including a plurality of elements or portions of elements, that can be isolated by valving, at least some segments including one or more pipes or portions of pipes and one or more nodes;
displaying the list of the segments on a display to a user;
simulating an outage of each of the segments;
calculating a criticality of each of the segments using one or more pressure dependent demand (PDD) functions, wherein the criticality of a segment includes a system demand shortfall defined as a ratio between actual demand satisfied by the water distribution network and total demand if the segment experienced the outage such that the plurality of elements of the segment are isolated from the rest of the water distribution network;
displaying a list of the calculated system demand shortfall for each of the segments on the display to the user; and
displaying a criticality summary that includes an average system demand shortfall for the water distribution network on the display to the user.

9. The non-transitory computer readable storage medium as defined in claim 8 wherein the program instructions for:
calculating a criticality further comprise program instructions for determining a shortfall in demand at a node of the water distribution network that occurs upon an outage of each of the segments.

10. The non-transitory computer readable storage medium as defined in claim 8 further comprising program instructions for:
calculating the hydraulic impact of the outages that are being simulated by determining an impact of pressure on flow supply by modeling pressure dependent demand in one or more selected segments.

11. The non-transitory computer readable storage medium as defined in claim 10 further comprising program instructions for:
determining pressure dependent demand using one or more of an orifice equation and monotonically increasing relationships.

12. The method as defined in claim 1 wherein the outage of each of the segments includes closing of selected isolating valves to shut down a respective segment.

13. A method comprising:
generating a model of a water distribution network based upon a set of elements, the set of elements including a plurality of pipes, a plurality of nodes and a plurality of isolating valves;
automatically identifying, by a hydraulic modeling platform, segments of the water distribution network based at least on locations of the isolating valves in the model of the water distribution network to produce a list of the segments of the water distribution network, the segments being the smallest portion of the water distribution network, including a plurality of elements or portions of elements, that can be isolated by valving, at least some of the segments including one or more pipes or portions of pipes and one or more nodes;
calculating, by the hydraulic modeling platform, a system demand shortfall that would result from an outage of each of the segments using one or more pressure dependent demand (PDD) functions that account for a reduction in flow because of a drop in pressure, wherein the system demand shortfall is calculated as a relation between actual demand satisfied by the water distribution network and the total demand if the segment experienced the outage such that the plurality of elements of the segment are isolated from the rest of the water distribution network; and displaying on a display to the user, by the hydraulic modeling platform, the calculated system demand shortfall that would result from each of the segments.

14. The method as defined in claim 13 wherein the outage includes closing of selected isolating valves to shut down the segment.

15. A non-transitory computer readable storage medium including program instructions operable to perform segmentation and criticality analysis for a water distribution network, the program instructions including instructions that when executed are operable to:

generate a model of a water distribution network based upon a set of elements, the set of elements including a plurality of pipes, a plurality of nodes and a plurality of isolating valves;

automatically identify segments of the water distribution network based at least on locations of the isolating valves in the model of the water distribution network to produce a list of the segments of the water distribution network, the segments being the smallest portion of the water distribution network, including a plurality of elements or portions of elements, that can be isolated by valving, at least some of the segments including one or more pipes or portions of pipes and one or more nodes;

calculate a system demand shortfall that would result from an outage of each of the segments using one or more pressure dependent demand (PDD) functions that account for a reduction in flow because of a drop in pressure, wherein the system demand shortfall is calculated as a relation between actual demand satisfied by the water distribution network and total demand if the segment experienced the outage such that the plurality of elements of the segment are isolated from the rest of the water distribution network; and display the calculated system demand shortfall that would result from each of the segments.

16. The method as defined in claim 13, further comprising:
displaying, on a display, the plurality of segments in a system map of the water distribution network, the system map showing the one or more elements or portions of elements that make up the segments, and isolating valves that define boundaries of the segments.

17. The method of claim 16, further comprising:
receiving a selection of a particular segment of the plurality of segments from a user; and
graphically indicating the selected segment, and one or more outage segments impacted by an outage of the selected segment, in the system map of the water distribution network displayed on the display.

18. The method as defined in claim 17, wherein the graphically indicating includes showing the selected segment and the one or more outage segments in different colors in the system map of the water distribution network.

19. The method as defined in claim 13, further comprising:
identifying, by the hydraulic modeling platform, a volume of water in each of the plurality of segments; and
displaying, on the display, the volume of water in each of the plurality of segments.

20. The method as defined in claim 13, further comprising:
identifying, by the hydraulic modeling platform, a number of isolating values needed to be operated in order to isolate each of the plurality of segments; and
displaying, on the display, the number of isolating values needed to be operated in order to isolate each of the plurality of segments.

21. The method as defined in claim 13, further comprising:
receiving, from the user, rules for valving in the water distribution network, the rules for valving indicating whether certain types of elements should be treated as isolating valves.

* * * * *